(12) United States Patent
Ningrat

(10) Patent No.: US 8,390,361 B2
(45) Date of Patent: Mar. 5, 2013

(54) CAPACITIVE TO VOLTAGE SENSING CIRCUIT

(75) Inventor: Kusuma Adi Ningrat, Singapore (SG)

(73) Assignee: STMicroelectronics Asia Pacific PTE Ltd, Singapore (SG)

( * ) Notice: Subject to any disclaimer, the term of this patent is extended or adjusted under 35 U.S.C. 154(b) by 78 days.

(21) Appl. No.: 13/038,526

(22) Filed: Mar. 2, 2011

(65) Prior Publication Data

US 2012/0161846 A1 Jun. 28, 2012

Related U.S. Application Data

(60) Provisional application No. 61/427,608, filed on Dec. 28, 2010.

(51) Int. Cl.
*G06G 7/18* (2006.01)
(52) U.S. Cl. .......................... 327/337; 327/517; 345/174
(58) Field of Classification Search .................. 327/336, 327/337, 517; 345/173, 174
See application file for complete search history.

(56) References Cited

U.S. PATENT DOCUMENTS

| | | | | |
|---|---|---|---|---|
| 5,359,156 A * | 10/1994 | Chan et al. | ................. | 178/20.02 |
| 5,854,625 A | 12/1998 | Frisch et al. | | |
| 5,977,803 A * | 11/1999 | Tsugai | ............................ | 327/94 |
| 6,075,520 A | 6/2000 | Inoue et al. | | |
| 7,030,860 B1 | 4/2006 | Hsu et al. | | |
| 7,454,967 B2 * | 11/2008 | Skurnik | ....................... | 73/146.5 |
| 7,812,825 B2 | 10/2010 | Sinclair et al. | | |
| 8,294,678 B2 * | 10/2012 | Wu | ............................... | 345/173 |
| 8,300,024 B2 * | 10/2012 | Wu | ............................... | 345/173 |
| 2007/0089527 A1 | 4/2007 | Shank et al. | | |
| 2007/0159184 A1 | 7/2007 | Reynolds et al. | | |
| 2007/0229470 A1 | 10/2007 | Snyder et al. | | |
| 2008/0007534 A1 | 1/2008 | Peng et al. | | |
| 2009/0231294 A1 * | 9/2009 | Wu | ............................... | 345/173 |
| 2009/0244014 A1 | 10/2009 | Hotelling et al. | | |
| 2009/0322410 A1 | 12/2009 | David et al. | | |
| 2010/0097077 A1 | 4/2010 | Philipp et al. | | |
| 2010/0149125 A1 | 6/2010 | Klinghult et al. | | |
| 2010/0149126 A1 | 6/2010 | Futter | | |
| 2010/0289503 A1 | 11/2010 | Reynolds et al. | | |
| 2011/0096024 A1 | 4/2011 | Kwak | | |
| 2011/0234528 A1 * | 9/2011 | Guedon et al. | ................. | 345/174 |
| 2011/0242048 A1 * | 10/2011 | Guedon et al. | ................. | 345/174 |
| 2011/0273400 A1 * | 11/2011 | Kwon et al. | ................... | 345/174 |
| 2012/0229421 A1 * | 9/2012 | Kim et al. | ....................... | 345/174 |

OTHER PUBLICATIONS

Lei, et al., "An Oversampled Capacitance-to-Voltage Converter IC With Application to Time-Domain Characterization of MEMS Resonators", IEEE Sensors Journal, vol. 5, No. 6, Dec. 2005, pp. 1353-1361.
U.S. Appl. No. 12/972,159 entitled "Capacitive Sensing Analog Front End", by Yannick Guedon et al, filed Mar. 31, 2010, 51 pgs.
U.S. Appl. No. 12/732,581 entitled "Sample and Hold Capacitance to Digital Converter" by Yannick Guedon, filed Mar. 26, 2010, 20 pgs.
U.S. Appl. No. 12/829,130 entitled "Sensing Phase Sequence to Suppress Single Tone Noise" by Inventor Kusuma Adi Ningrat, filed Jul. 1, 2010, 27 pgs.

* cited by examiner

*Primary Examiner* — Lincoln Donovan
*Assistant Examiner* — William Hernandez
(74) *Attorney, Agent, or Firm* — Gardere Wynne Sewell LLP; Andre M. Szuwalski

(57) ABSTRACT

A circuit for converting a measured variable capacitance to an output voltage signal includes a charge amplifier circuit selectively coupled to an integrator circuit. The charge amplifier circuit, in one implementation, is configured as a high pass filter. In another implementation, the charge amplifier circuit is configured as a combination high pass and low pass filter. The charge amplifier circuit is selectively coupled to the integrator circuit when the circuit forces a switch in voltage across a measurement capacitor.

24 Claims, 2 Drawing Sheets

CAPACITIVE TO VOLTAGE SENSING CIRCUIT

BACKGROUND

1. Technical Field

The present invention relates generally to circuitry for sensing a variable capacitance and, more particularly, to circuitry for sensing an output from a capacitive touch device sensor and converting that output to an analog and/or digital voltage signal.

2. Description of Related Art

A touch device includes a sensor surface and means for detecting whether an object (such as a finger, nail, pen, and the like) is either in contact with the surface (also referred to in the art as "touch detection") or is approaching the surface (also referred to in the art as "proximity detection"). The touch device may be integrated with a display device to form a component commonly referred to as a "touch screen."

The touch device is comprised, generally speaking, of a capacitance whose value is modulated by the presence of the touching or approaching object. A sensing circuit may be coupled to sense changes in the capacitance value and convert those sensed changes into a voltage signal. The generated voltage signal may then be further processed as desired and needed for certain applications. For example, the voltage signal may be converted by an analog-to-digital controller into a digital value, with that digital value being used to trigger certain control functions. The overall process is commonly referred to as capacitance to voltage sensing (or conversion).

Touch devices are not the only devices where a physical parameter can be monitored by sensing variation in capacitance value. For example, pressure sensors, movement sensors and accelerometers are well known in the art to utilize a capacitive sensing technique. Each of these devices requires some form of a capacitance to voltage sensing circuit.

Signal to noise ratio (SNR) is a critical factor in capacitive sensing type devices. In operation, it is well known that a noise component can be introduced on the sensing capacitance. It can be difficult in some cases to extract the signal of interest relating to the changed capacitance value (relating to the presence of the touching or approaching object) from the introduced noise.

Reference is now made to FIG. 1 which illustrates a prior art capacitance to voltage sensing circuit. The variable capacitance to be monitored is represented by a measurement capacitor Cm. A first plate of measurement capacitor Cm is coupled through a switch S1 to a force node F. A second plate of capacitor Cm is coupled through a switch S2 to a sense node S. Force node F is coupled through a switch S3 to ground and through a switch S4 to a reference voltage Vdd. The sense node S is coupled through a switch S5 to a capacitance to voltage sensing circuit 10 and through a switch S6 to a reference voltage Vcm. The reference voltage Vcm can be any desired value, and is commonly zero volts (or ground). The voltage sensing circuit 10 comprises an operational amplifier 12 having a first input coupled to the sense node S and a second input coupled to the reference voltage Vcm. An output of the operational amplifier 12 is coupled to the first input (and sense node S) through a holding capacitor Ch (and is further coupled to the sense node S through switch S5). A switch S7 is coupled in parallel with the holding capacitor Ch between the output of the operational amplifier 12 and the first input. The operational amplifier 12 and holding capacitor Ch function, as will be described in more detail below, as an integrator circuit. The output of the operational amplifier 12 is further coupled to the input of an analog-to-digital converter (ADC) circuit 14.

The switches S1 and S2 function as a switch matrix to selectively connect the voltage sensing circuit 10 to a selected measurement capacitor Cm in situations where the voltage sensing circuit 10 is a shared resource for multiple measurement capacitors Cm, as would be the case in a touch device having a matrix configuration. It will be recognized that in implementations were voltage sensing circuit 10 need not be a shared resource the switches S1 and S2 can be deleted or left in the closed position.

A switch control circuit 18 is provided to control the actuation of the switches S1-S7. The switches S1-S7 may comprise MOSFET type switches. The control circuit 18 operates in accordance with the multi-phase timing control operation in a manner to be described.

Operation of the circuitry in response to the control circuit 18 is as follows: During a first phase, switches S1 and S2 are closed to connect capacitor Cm to the force node F and sense node S. Switch S4 is closed to apply reference voltage Vdd to the force node F. Switch S6 is closed to apply reference voltage Vcm to the sense node S. Switch S7 is also closed. Thus, in this first phase, the measurement capacitor Cm and the holding capacitor Ch are both reset, and a voltage is applied across the measurement capacitor Cm which stores charge as a function of the applied voltage and the presence of the touching or approaching object.

During a second phase, switches S1 and S2 remain closed, but switches S4 and S6 are opened, while switches S3 and S5 are closed. Also, switch S7 is opened. Thus, the force node F is grounded, and the sense node S is coupled to voltage sensing circuit 10. This is referred to as a "forced switching" of the measurement capacitor voltage. In this second phase, the charge previously stored in the measurement capacitor Cm is transferred to the holding capacitor Ch by way of an integration process.

During a third phase, switches S1 and S2 remain closed, but switches S4 and S6 are closed, while switches S3 and S5 are opened. This isolates the measurement capacitor Cm and sense node S from the input of the operational amplifier 12. At this point, the ADC circuit 14 is activated to convert the voltage represented by the transferred charge, and present at the output of the operational amplifier 12, to an output digital signal 16. The analog-to-digital conversion will last for the duration of the third phase. The multi-phase process then repeats for the measurement capacitor Cm (or for other selected measurement capacitors in a matrix configuration by selectively controlling switches S1 and S2).

For a given measurement capacitor Cm, the voltage at the output of the operational amplifier 12 in the third phase is: Vout=Vcm+Cm/Ch*Vdd. To the extent the capacitance of the measurement capacitor Cm varies (due to object touching or proximity), then the variation in capacitance $\Delta$Cm will produce a variation in the voltage at the output of the operational amplifier 12 in the third phase: $\Delta$Vout=$\Delta$Cm/Ch*Vdd.

In the same manner it is possible to derive the effect on the output voltage due to the introduction of noise. Such noise could, for example, be introduced to the sense node S, and can be modeled by a noise capacitance Cn (or other applied noise voltage) coupled to sense node S. The change in output voltage at the output of the operational amplifier 12 is then given by: $\Delta$Vout=Cn/Ch*Vdd. The signal to noise ratio (SNR) is thus given by SNR=$\Delta$Cm/(2*Cn)*(Vdd/Vnpp), where Vnpp=the difference between the high value of the noise voltage and the low value of the noise voltage.

In an exemplary scenario, consider $\Delta Cm=0.2$ pF, $Cn=0.5$ pF, $Vdd=1.8V$ and $Vnpp=2V$. This results in a signal to noise ratio $SNR=0.18$. If the input range is 3 pF (i.e., $Ch=6$ pF), the output swing is 900 mV for 3 pF and 600 mV for 2 pF. For a $\Delta Cm=0.2$ pF, the variation is only 60 mV relating to the presence of the touching or approaching object. However, the output peak-to-peak noise introduced by the noise source can be as much as 333 mV. In this situation, it is not possible (or is extremely difficult) to extract the wanted signal information out from the noise output voltage.

Again, $SNR=\Delta Cm/(2*Cn)*(Vdd/Vnpp)$. As $\Delta Cm$ and $Cn$ are environment dependent variables, the only two parameters in the SNR equation that can be effectively controlled are Vdd and Vnpp. Thus, one solution to addressing the SNR issue is to boost the desired signal by using a higher reference voltage Vdd applied to the force node F of the measurement capacitor Cm. For example, a higher voltage in this scenario might be in the range of 20V (as compared to a lower voltage of 1.8V for Vdd as discussed above). The higher reference voltage Vdd will produce a higher desired signal value, and the SNR will improve proportionally to increases in desired signal magnitude.

There is a need in the art to provide a capacitance to voltage sensing circuit suited to operation at such higher reference voltage Vdd levels.

SUMMARY

In an implementation, a circuit comprises: a sense node, where the sense node is adapted to supply a capacitive charge resulting from a forced switching of a voltage across a measurement capacitor; an amplifier circuit having a first input coupled to the sense node and further having a first output, the amplifier circuit adapted to amplify the capacitive charge from the sense node; an integrator circuit having a second input and a second output, the integrator adapted to integrate the amplified capacitive charge and produce an output voltage at the second output; a first switch adapted to selectively couple the first output of the charge amplifier circuit to the second input of the integrator circuit; and a control circuit adapted to control actuation of the first switch to selectively couple the first output to the second input when forced switching of the voltage across the measurement capacitor occurs.

In another implementation, a circuit comprises: a capacitive touch device, a capacitance to voltage conversion circuit and a control circuit. The capacitive touch device includes: a sense node; a measurement capacitor coupled to the sense node; and switching circuitry adapted to support forced switching of a voltage across the measurement capacitor, wherein the sense node is adapted to supply a capacitive charge resulting from forced switching of the voltage across the measurement capacitor. The capacitance to voltage conversion circuit comprises: an amplifier circuit having a first input coupled to the sense node and further having a first output, the amplifier circuit adapted to amplify the capacitive charge from the sense node; an integrator circuit having a second input and a second output, the integrator adapted to integrate the amplified capacitive charge and produce an output voltage at the second output; and a first switch adapted to selectively couple the first output of the charge amplifier circuit to the second input of the integrator circuit. The control circuit is adapted to control actuation of the switching circuitry in the capacitive touch device to perform forced switching of the voltage across the measurement capacitor and control actuation of the first switch in the capacitance to voltage conversion circuit to selectively couple the first output to the second input when the switching circuitry in the capacitive touch device is actuated to perform forced switching of the voltage across the measurement capacitor.

In another implementation, a method comprises: resetting a charge amplifier and an integrator; dis-coupling an output of the charge amplifier from an input of the integrator; filtering a sense node coupled to a measurement capacitor; forcing a switch in voltage across the measurement capacitor to supply a capacitive charge to the sense node; when forcing, coupling an output of the charge amplifier to an input of the integrator; amplifying the supplied capacitive charge in the charge amplifier; and integrating the amplifier capacitive charge in the integrator to produce a voltage output.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
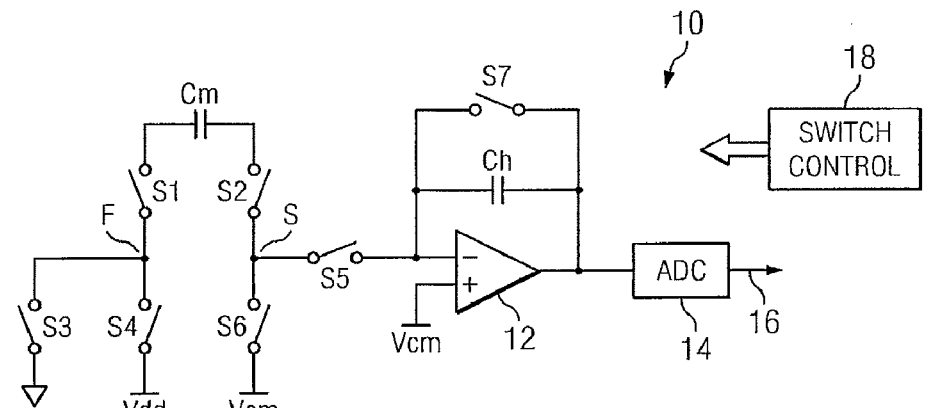
FIG. 1 is a circuit diagram of a prior art capacitance to voltage sensing circuit.
Figure 2:
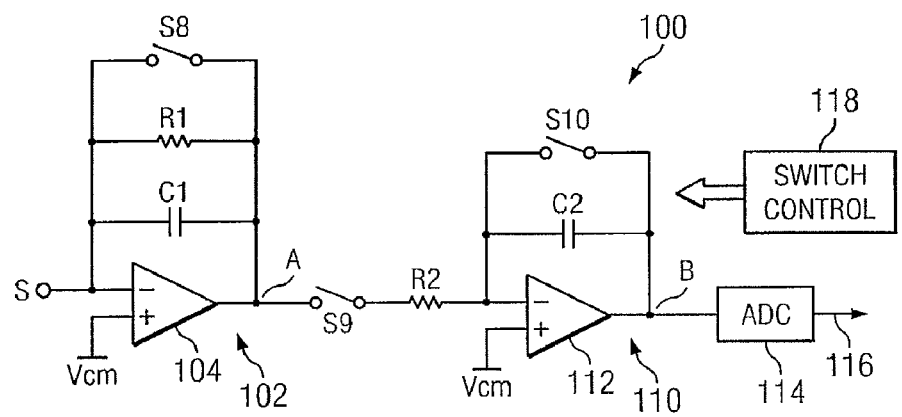
FIG. 2 is a circuit diagram of a first implementation of a capacitance to voltage sensing circuit.

Reference is now made to FIG. 2 which illustrates a circuit diagram of a first implementation of a capacitance to voltage sensing circuit 100. For simplification of the drawing, the measurement capacitor Cm and switches S1-4 and S6 are not shown in FIG. 2 (and the position of switch S5 is changed (see, switch S9 as discussed below)). It will be understood that a capacitive sensor, with a measurement capacitor Cm and associated switching circuitry for forced voltage switching, perhaps of the configuration illustrated in FIG. 1 or of any other configuration known in the art, is coupled to the sense node S of FIG. 2.

In this implementation, the sense node S is coupled to a charge amplifier 102. The charge amplifier 102 comprises a first operational amplifier 104 having a first input coupled to the sense node S and a second input coupled to the reference voltage Vcm. The reference voltage Vcm can be any desired value, and is commonly zero volts (or ground). An output A of the operational amplifier 104 is coupled to the first input (and sense node S) through a capacitor C1 and a resistor R1, wherein C1 and R1 are coupled in parallel with each other between the output A and the first input. A switch S8 is coupled in parallel with the capacitor C1 and resistor R1 between the output A of the operational amplifier 104 and the first input. In a preferred implementation, the first input of operational amplifier 104 is directly connected to the sense node S without any intervening switching circuit.

The voltage sensing circuit 100 further includes an integrator 110. The integrator 110 comprises a second operational amplifier 112 having a first input coupled to the output A of the first operational amplifier 104 and a second input coupled to the reference voltage Vcm. In a preferred implementation, the coupling of the output A of the first operational amplifier 104 to the first input of the second operational amplifier 112 is made through a switch S9. An output B of the operational amplifier 112 is coupled to the first input of second operational amplifier 112 through a capacitor C2 (and further coupled to the output A through the switch S9). A switch S10 is coupled in parallel with the capacitor C2 between the output B of the operational amplifier 112 and the first input (and output A). In a preferred embodiment, the coupling of the output A of the first operational amplifier 104 to the first input of the second operational amplifier 112 is further made through a resistor R2 connected in series with the switch S9.

The output B of the operational amplifier 112 is further coupled to the input of an analog-to-digital converter (ADC) circuit 114 which converts the analog voltage at output B to an output digital signal 116.

A switch control circuit 118 is provided to control the actuation of the switches S1-S4, S6 and S8-S10. The switches S1-S4, S6 and S8-S10 may comprise MOSFET type switches. The control circuit 118 operates in accordance with the multi-phase timing control operation in a manner to be described.

Figure 4:
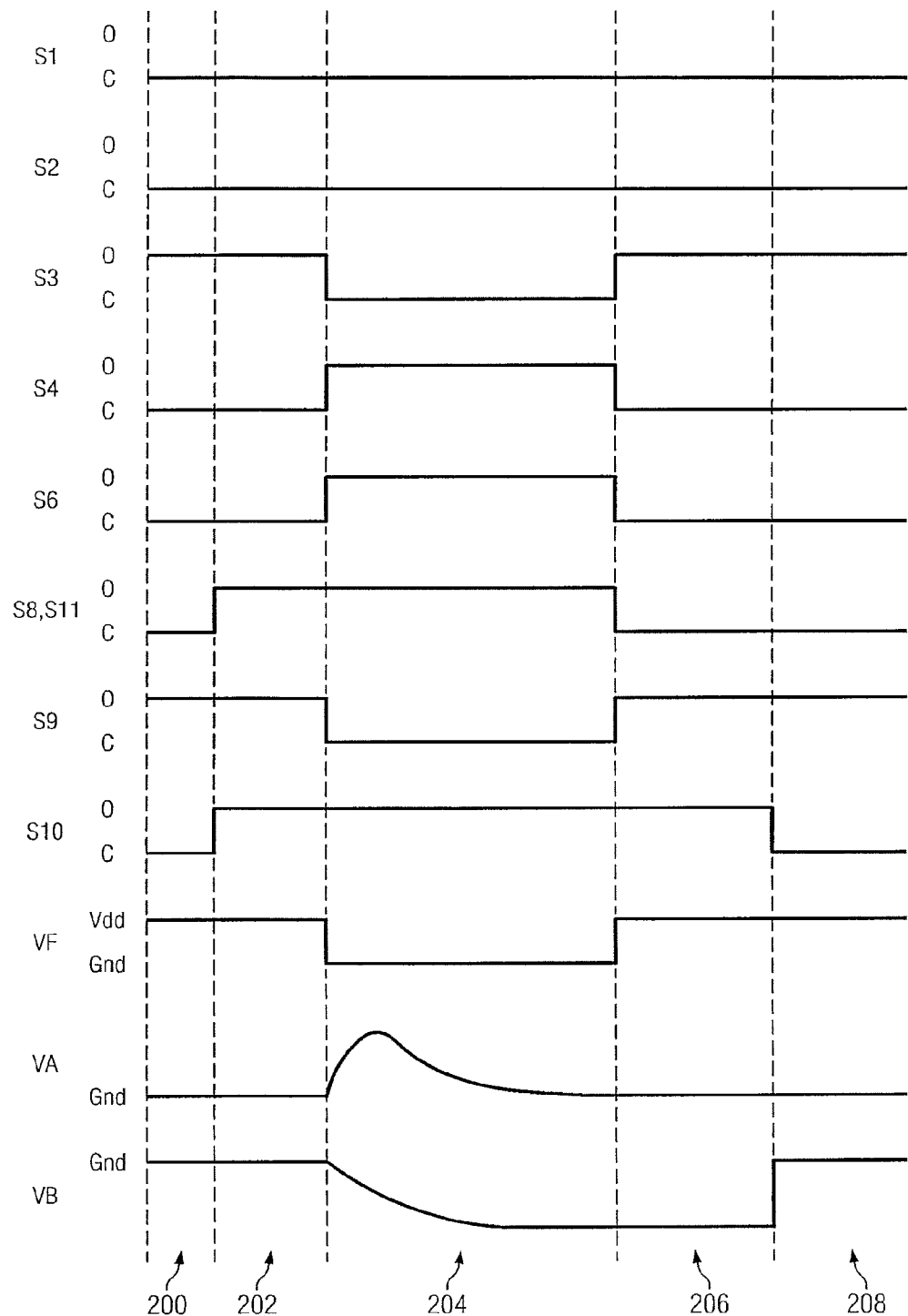
FIG. 4 is a timing diagram illustrating operation of the circuits of FIGS. 2 and 3.

With additional reference to the timing diagram of FIG. 4, operation of the voltage sensing circuit 100 under the control of control circuit 118 is as follows: During a first phase 200, switches S8 and S10 are closed (reference "C" in FIG. 4). This effectively resets the capacitor C1 of the amplifier circuit 102 and the capacitor C2 of the integrator circuit 110. Additionally, switches S1 and S2 (see, FIG. 1) are closed to connect capacitor Cm to the force node F and sense node S. Switch S4 is closed to apply reference voltage Vdd to the force node F. Switch S6 is closed to apply reference voltage Vcm to the sense node S. Switches S3 and S9 are open (reference "O" in FIG. 4), with S9 functioning to dis-couple the amplifier circuit 102 from the integrator circuit 110.

During a second phase 202, switches S8 and S10 are opened. The capacitor C1 and resistor R1 form a high-pass filtering structure to filter the voltage at the sense node S. A settling time is provided so as to allow the output A of the amplifier circuit 102 to settle and reach a desired voltage level (for example, 0V if Vcm=0V). In this regard, the opening of switch S8 may produce noise at the sense node S which introduces a DC error that is removed by the high pass filtering structure during the settling time period.

During a third phase 204, switches S4 and S6 are opened. Furthermore, switch S3 is closed to instead apply the ground voltage Gnd to the force node F. This is referred to as a "forced switching" of the measurement capacitor voltage. At the same time, switch S9 is closed to couple the charge amplifier 102 to the integrator 110. Charge is then transferred from the measurement capacitor Cm through the charge amplifier 102 for storage on capacitor C2 of the integrator 110. This produces a rise in the voltage at the output A of the charge amplifier 102 and a fall of the output B of the integrator 110. A delay period is provided to enable the voltage at output node A of the charge amplifier 102 to settle and also allow the voltage at the output B of the integrator 110 to settle.

During a fourth phase 206, switch S9 is opened to disconnect the charge amplifier 102 from the integrator 110. Switch S8 is also closed to reset the capacitor C1 of the amplifier circuit 102. Switch S3 is opened to disconnect the force node F from ground. Switches S4 and S6 are closed to connect the measurement capacitor between Vdd and Vcm. At this point, the ADC circuit 114 is activated to convert the voltage represented by the transferred charge at output node B to a digital signal 116. The analog-to-digital conversion will last for the duration of the fourth phase.

During a fifth phase 208, switch S10 is closed to reset the capacitor C2 of the integrator 110.

The process then repeats for the measurement capacitor Cm (or for other measurement capacitors in a matrix configuration by selectively controlling switches S1 and S2).

At the end of the conversion process, the voltage at output node B is represented by the equation: $VB=(Cm*R1*Vdd)/(R2*C2)$. As an example, for Vdd=18V, R1=15 Kohm, Cm=2 pF, C1=10 pF, R2=100 Kohm and C2=5 pF, the output voltage VB=1.08V regardless of any parasitic components (resistive or capacitive) that are associated with the capacitive sensor (such as those components within the touch device or touch screen).

Figure 3:
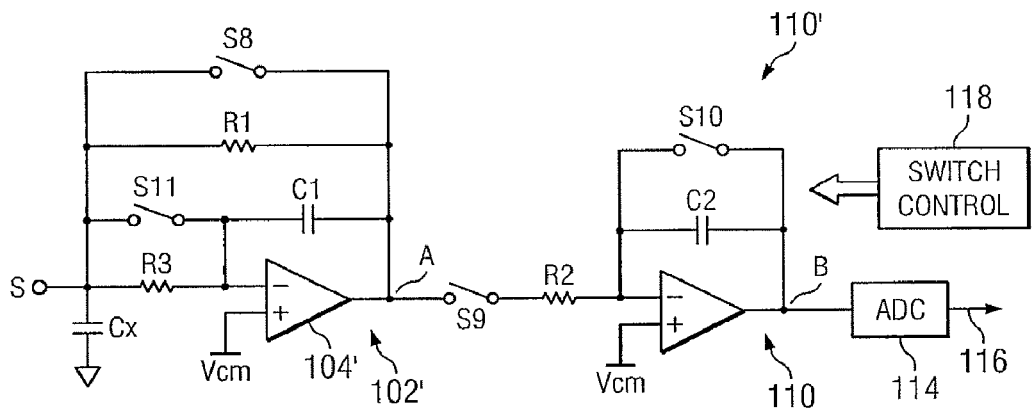
FIG. 3 is a circuit diagram of a second implementation of a capacitance to voltage sensing circuit.

Parasitic resistive or capacitive components may cause the SNR value to be lower at locations closer to the sense node S, and higher at locations farther from the sense node S. Thus, to address this issue, the circuit of FIG. 2 can be modified to introduce low-pass filter characteristics to assist in noise filtering. This modified circuit will now be discussed with reference to FIG. 3 which illustrates a circuit diagram of a second implementation of a capacitance to voltage sensing circuit 100'. For simplification of the drawing, the measurement capacitor Cm and switches S1-4 and S6 are not shown in FIG. 3 (and the position of switch S5 is changed (see, switch S9 as discussed below)). It will be understood that a capacitive sensor, with a measurement capacitor Cm and associated switching circuitry, perhaps of the configuration illustrated in FIG. 1 or of any other configuration known in the art, is coupled to the sense node S of FIG. 3.

In this implementation, the sense node S is coupled to a charge amplifier 102'. The charge amplifier 102' comprises a first operational amplifier 104' having a first input coupled to the sense node S and a second input coupled to the reference voltage Vcm. The first input is coupled to the sense node S through a resistor R3. A switch S11 is coupled in parallel with the resistor R3 between the first input and the sense node S, and thus functions, when closed, to shunt sense node S to the first input. The reference voltage Vcm can be any desired value, and is commonly zero volts (or ground). An output A of the operational amplifier 104' is coupled to the first input through a capacitor C1, and is further coupled to the sense node S through either the switch S11 or resistor R3. The output A of the operational amplifier 104' is further coupled to the sense node S through a resistor R1. When switch S11 is closed, C1 and R1 are coupled in parallel with each other between the output A and the first input (as well as sense node S). Switch S8 is coupled in parallel with the capacitor C1 and resistor R1 between the output A of the operational amplifier 104 and the sense node S (and further the first input where switch S11 is closed).

The resistor R3 functions with capacitance Cx as a low pass filter to improve noise filtering of the voltage sensing circuit 100'. The capacitance Cx can, for example, be the parasitic capacitance associated with the capacitive sensor (such as those components within the touch device or touch screen). Alternatively, the capacitance Cx can be provided as a capacitor within the amplifier 102' coupled between sense node S and ground. The presence of resistor R3 will not adversely affect the settling time of the charge amplifier 102'.

It will be noted that the feedback through resistor R1 is not directly connected to the first input of amplifier 104' (unless switch S11 is closed). The feedback connection is instead made to sense node S. This has the effect of speeding up the settling time of the charge amplifier 102' while still obtaining the low-pass filtering effect provided by a relatively large resistance value for resistor R3.

The voltage sensing circuit 100' further includes an integrator 110. The integrator 110 comprises a second operational amplifier 112 having a first input coupled to the output A of the first operational amplifier 104' and a second input coupled to the reference voltage Vcm. In a preferred implementation, the coupling of the output A of the first operational amplifier 104' to the first input of the second operational amplifier 112 is made through a switch S9. An output B of the operational amplifier 112 is coupled to the first input of second operational amplifier 112 through a capacitor C2 (and further coupled to the output A through the switch S9). A switch S10 is coupled in parallel with the capacitor C2 between the output B of the operational amplifier 112 and the first input (and output A). In a preferred embodiment, the coupling of the output A of the first operational amplifier 104' to the first input of the second operational amplifier 112 is further made through a resistor R2 connected in series with the switch S9.

The output B of the operational amplifier 112 is further coupled to the input of an analog-to-digital converter (ADC) circuit 114 which converts the analog voltage at output B to an output digital signal 116.

A switch control circuit 118 is provided to control the actuation of the switches S1-S4, S6 and S8-S11. The switches S1-S4, S6 and S8-S11 may comprise MOSFET type switches. The control circuit 118 operates in accordance with the multi-phase timing control operation in a manner to be described.

With additional reference to the timing diagram of FIG. 4, operation of the voltage sensing circuit 100 under the control of control circuit 118 is as follows: During a first phase 200, switches S8, S10 and S11 are closed (reference "C" in FIG. 4). This effectively resets the capacitor C1 of the amplifier circuit 102' and the capacitor C2 of the integrator circuit 110. Additionally, switches S1 and S2 (see, FIG. 1) are closed to connect capacitor Cm to the force node F and sense node S. Switch S4 is closed to apply reference voltage Vdd to the force node F. Switch S6 is closed to apply reference voltage Vcm to the sense node S. Switches S3 and S9 are open (reference "O" in FIG. 4), with switch S9 functioning to dis-couple the amplifier circuit 102' from the integrator circuit 110.

During a second phase 202, switches S8, S10 and S11 are opened. The capacitor C1 and resistor R1 form a high-pass filtering structure to filter the voltage at the sense node S. The capacitor Cx and resistor R3 form a low-pass filtering structure to filter the voltage at the sense node S. A settling time is provided so as to allow the output A of the amplifier circuit 102' to settle and reach a desired voltage level (for example, 0V if Vcm=0V). In this regard, the opening of switch S8 may produce noise introducing a DC error that is removed by the filtering structure during the settling time period.

In effect, the high-pass filtering structure and low-pass filtering structure of the amplifier circuit 102' function to define a band-pass transfer function for the amplifier circuit 102'. In one example embodiment, the passband of this band-pass transfer function has a bandwidth selected to be from 60 kHz-616 kHz for R3=200 Kohm, R1=15 Kohm, C1=10 pF, and Cx=20 pF. In another example embodiment, the bandwidth may be selected to be from 98 kHz-6 MHz by selecting R3=150 Kohm, R1=4 Kohm, C1=10 pF, and Cx=10 pF.

During a third phase 204, switches S4 and S6 are opened. Furthermore, switch S3 is closed to instead apply the ground voltage Gnd to the force node F. This is referred to as a "forced switching" of the measurement capacitor voltage. At the same time, switch S9 is closed to couple the charge amplifier 102 to the integrator 110. Charge is then transferred from the measurement capacitor Cm through the charge amplifier 102 for storage on capacitor C2 of the integrator 110. This produces a rise in the voltage at the output A of the charge amplifier 102 and a fall of the output B of the integrator 110. A delay period is provided to enable the voltage at output node A of the charge amplifier 102' to settle and allow the voltage at output node B of the integrator 110 to settle.

During a fourth phase 206, switch S9 is opened to disconnect the charge amplifier 102' from the integrator 110. Switches S8 and S11 are also closed to reset the capacitor C1 of the amplifier circuit 102'. Switch S3 is opened to disconnect the force node F from ground. Switches S4 and S6 are closed to connect the measurement capacitor between Vdd and Vcm. At this point, the ADC circuit 114 is activated to convert the voltage represented by the transferred charge at output node B to a digital signal 116. The analog-to-digital conversion will last for the duration of the fourth phase.

During a fifth phase 208, switch S10 is closed to reset the capacitor C2 of the integrator 110.

The process then repeats for the measurement capacitor Cm (or for other measurement capacitors in a matrix configuration by selectively controlling switches S1 and S2).

At the end of the conversion process, the voltage at output node B is represented by the equation: $VB=(Cm*R1*Vdd)/(R2*C2)$. As an example, for Vdd=18V, R1=15 Kohm, Cm=2 pF, C1=10 pF, R2=100 Kohm and C2=5 pF, the output voltage VB=1.08V regardless of any parasitic components (resistive or capacitive) that are associated with the capacitive sensor (such as those components within the touch device or touch screen).

In a practical implementation with a touch device such as a large touch screen panel with the following parasitic component values: Rp min=10 Kohms, Rp max=70 Kohms, Cp min=20 pF, Cp max=100 pF, panel settling time=50 us, and a sensing time (including reset) of 110 us, the circuit 100 or 100' can have Vdd=18V, R1=15 Kohms, R2=100 Kohms, R3=200 Kohms, C1=10 pF and C2=10 pF. The results are as follows: for minimum parasitic (at the corner of the panel nearest the circuit connection), the signal=54 mV with a SNR 1× acquisition=14.28 (with 2 Vpp white noise injected through 0.4 pF); for maximum parasitic (at the corner of the panel nearest the circuit connection), the signal=53.5 mV with a SNR 1× acquisition=35.79 (with 2 Vpp white noise injected through 0.4 pF); and maximum capacitance to voltage plus integrator swing with Cm+5 pF producing a swing of 3.37V. This large panel is of a 31×54 (15.4" display) size.

In a practical implementation with a touch device such as a small touch screen panel with the following parasitic component values: Rp min=1 Kohms, Rp max=4 Kohms, Cp min=10 pF, Cp max=60 pF, panel settling time=1.68 us, and a sensing time (including reset) of 13 us, the circuit 100 or 100' can have Vdd=18V, R1=4 Kohms, R2=100 Kohms, R3=150 Kohms, C1=10 pF and C2=3 pF. The results are as follows: for minimum parasitic (at the corner of the panel nearest the circuit connection), the signal=47.6 mV with a SNR 1× acquisition=12.56 (with 2 Vpp white noise injected through 0.4 pF); for maximum parasitic (at the corner of the panel nearest the circuit connection), the signal=47.8 mV with a SNR 1× acquisition=15.22 (with 2 Vpp white noise injected through 0.4 pF); and maximum capacitance to voltage plus integrator swing with Cm+5 pF producing a swing of 1.387V. This small panel is of a 16×12 size.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
  a sense node, where the sense node is adapted to supply a capacitive charge resulting from a forced switching of a voltage across a measurement capacitor;
  an amplifier circuit having a first input coupled to the sense node and further having a first output, the amplifier circuit including a filtering structure adapted to amplify and filter the capacitive charge from the sense node;
  an integrator circuit having a second input and a second output, the integrator circuit adapted to integrate the amplified capacitive charge and produce an output voltage at the second output;
  a first switch adapted to selectively couple the first output of the amplifier circuit to the second input of the integrator circuit; and
  a control circuit adapted to control actuation of the first switch to selectively couple the first output to the second input when forced switching of the voltage across the measurement capacitor occurs.

2. The circuit of claim 1, wherein the filtering structure of the amplifier circuit is a high pass filtering structure.

3. The circuit of claim 2, wherein the filtering structure of the amplifier circuit is further a low pass filtering structure.

4. The circuit of claim 1, wherein the filtering structure of the amplifier circuit is a low pass filtering structure.

5. The circuit of claim 4, wherein the filtering structure of the amplifier circuit is further a high pass filtering structure.

6. A circuit, comprising:
  a sense node, where the sense node is adapted to supply a capacitive charge resulting from a forced switching of a voltage across a measurement capacitor;
  an amplifier circuit having a first input coupled to the sense node and further having a first output, the amplifier circuit adapted to amplify the capacitive charge from the sense node;
  an integrator circuit having a second input and a second output, the integrator circuit adapted to integrate the amplified capacitive charge and produce an output voltage at the second output;
  a first switch adapted to selectively couple the first output of the amplifier circuit to the second input of the integrator circuit; and
  a control circuit adapted to control actuation of the first switch to selectively couple the first output to the second input when forced switching of the voltage across the measurement capacitor occurs,
  wherein the amplifier circuit further comprises a second switch adapted to reset the amplifier circuit, and wherein the integrator circuit further comprises a third switch adapted to reset the integrator circuit, and wherein the control circuit is further adapted to control actuation of the second and third switches to reset the amplifier circuit and integrator circuit, respectively, prior to forced switching of the voltage across the measurement capacitor.

7. The circuit of claim 1, wherein the control circuit is further adapted to control forced switching of the voltage across the measurement capacitor.

8. A circuit, comprising:
  a sense node, where the sense node is adapted to supply a capacitive charge resulting from a forced switching of a voltage across a measurement capacitor;
  an amplifier circuit having a first input coupled to the sense node and further having a first output, the amplifier circuit adapted to amplify the capacitive charge from the sense node and comprising:
    an operational amplifier circuit having an input and an output,
    a capacitor coupled between the input and output,
    a resistor coupled between the input and output in parallel with the capacitor, and
    a second switch coupled between the input and output in parallel with the capacitor;
  an integrator circuit having a second input and a second output, the integrator circuit adapted to integrate the amplified capacitive charge and produce an output voltage at the second output;
  a first switch adapted to selectively couple the first output of the amplifier circuit to the second input of the integrator circuit; and
  a control circuit adapted to control actuation of the first switch to selectively couple the first output to the second input when forced switching of the voltage across the measurement capacitor occurs.

9. The circuit of claim 8, wherein the control circuit is further adapted to control actuation of the second switch to reset the amplifier circuit prior to forced switching of the voltage across the measurement capacitor.

10. A circuit, comprising:
  a sense node, where the sense node is adapted to supply a capacitive charge resulting from a forced switching of a voltage across a measurement capacitor;
  an amplifier circuit having a first input coupled to the sense node and further having a first output, the amplifier circuit adapted to amplify the capacitive charge from the sense node and comprising:
    an input node coupled to the sense node,
    an operational amplifier circuit having an input and an output;
    a first capacitor coupled between the input and the output of the operational amplifier circuit,
    first resistor coupled between the input node and the output of the operational amplifier circuit,
    a second capacitor coupled between the input node and a reference node,
    a second resistor coupled between the input node and the input of the operational amplifier circuit,
    a second switch coupled between the input node and the output of the operational amplifier circuit in parallel with the first resistor, and
    a third switch coupled between the input node and the input of the operational amplifier circuit in parallel with the second resistor;
  an integrator circuit having a second input and a second output, the integrator circuit adapted to integrate the amplified capacitive charge and produce an output voltage at the second output;
  a first switch adapted to selectively couple the first output of the amplifier circuit to the second input of the integrator circuit; and
  a control circuit adapted to control actuation of the first switch to selectively couple the first output to the second input when forced switching of the voltage across the measurement capacitor occurs.

11. The circuit of claim 10, wherein the control circuit is further adapted to control actuation of the second and third switches to reset the amplifier circuit prior to forced switching of the voltage across the measurement capacitor.

12. The circuit of claim 10 wherein the second capacitor is a parasitic capacitance associated with a device including the measurement capacitor.

13. A circuit, comprising:
a capacitive touch device including:
- a sense node;
- a measurement capacitor coupled to the sense node; and
- switching circuitry adapted to support forced switching of a voltage across the measurement capacitor, wherein the sense node is adapted to supply a capacitive charge resulting from forced switching of the voltage across the measurement capacitor;

a capacitance to voltage conversion circuit, comprising:
- an amplifier circuit having a first input coupled to the sense node and further having a first output, the amplifier circuit including a filtering structure adapted to amplify and filter the capacitive charge from the sense node;
- an integrator circuit having a second input and a second output, the integrator circuit adapted to integrate the amplified capacitive charge and produce an output voltage at the second output; and
- a first switch adapted to selectively couple the first output of the amplifier circuit to the second input of the integrator circuit; and a control circuit adapted to control actuation of the switching circuitry in the capacitive touch device to perform forced switching of the voltage across the measurement capacitor and control actuation of the first switch in the capacitance to voltage conversion circuit to selectively couple the first output to the second input when the switching circuitry in the capacitive touch device is actuated to perform forced switching of the voltage across the measurement capacitor.

14. The circuit of claim 13, wherein the filtering structure of the amplifier circuit includes a high pass filtering structure.

15. The circuit of claim 14, wherein the filtering structure of the amplifier circuit further includes a low pass filtering structure.

16. The circuit of claim 13, wherein the amplifier circuit comprises:
- an operational amplifier circuit having an input and an output;
- a capacitor coupled between the input and output;
- a resistor coupled between the input and output in parallel with the capacitor; and
- a second switch coupled between the input and output in parallel with the capacitor; and
- wherein the control circuit is further adapted to control actuation of the second switch to shunt the capacitor prior to actuating the switching circuitry in the capacitive touch device to perform forced switching of the voltage across the measurement capacitor.

17. The circuit of claim 13 wherein the amplifier circuit comprises:
- an input node coupled to the sense node;
- an operational amplifier circuit having an input and an output;
- a first capacitor coupled between the input and the output;
- a first resistor coupled between the input node and the output;
- a second capacitor coupled between the input node and a reference node;
- a second resistor coupled between the input node and the input of the operational amplifier;
- a second switch coupled between the input node and the output in parallel with the first resistor; and
- a third switch coupled between the input node and the input of the operational amplifier in parallel with the second resistor; and
- wherein the control circuit is further adapted to control actuation of the second and third switches to shunt the first capacitor and first and second resistors prior to actuating the switching circuitry in the capacitive touch device to perform forced switching of the voltage across the measurement capacitor.

18. The circuit of claim 17 wherein the second capacitor is a parasitic capacitance associated with a device including the measurement capacitor.

19. A method, comprising:
- resetting a charge amplifier and an integrator;
- dis-coupling an output of the charge amplifier from an input of the integrator;
- filtering a sense node coupled to a measurement capacitor;
- forcing a switch in voltage across the measurement capacitor to supply a capacitive charge to the sense node;
- when forcing, coupling an output of the charge amplifier to an input of the integrator;
- amplifying the supplied capacitive charge in the charge amplifier; and
- integrating the amplifier capacitive charge in the integrator to produce a voltage output.

20. The method of claim 19, wherein filtering comprises filtering an offset arising from charge amplifier resetting.

21. The method of claim 19, further comprising, after integrating, dis-coupling the charge amplifier from the integrator and converting the voltage output from the integrator to a digital output signal.

22. The method of claim 19, wherein filtering the sense node coupled to the measurement capacitor comprises performing high-pass filtering.

23. The method of claim 22, wherein filtering the sense node coupled to the measurement capacitor further comprises performing low-pass filtering.

24. The method of claim 19, wherein filtering is performed by operation of the charge amplifier.

* * * * *